United States Patent
Nakano et al.

[11] Patent Number: 5,888,633
[45] Date of Patent: Mar. 30, 1999

[54] MICRO-STRUCTURES HAVING STRUCTURAL MEMBERS CAPABLE OF WITHSTANDING PERMANENT BEND

[75] Inventors: Motoo Nakano; Hiroshi Nomura; Masaya Katayama; Toshimi Ikeda; Fumihiko Inoue; Junichi Ishikawa, all of Kawasaki; Masahiro Kuwamura, Kasugai, all of Japan

[73] Assignee: Fujitsu Limited & Fujitsu VLSI Limited, Kawasaki, Japan

[21] Appl. No.: 820,359

[22] Filed: Mar. 12, 1997

Related U.S. Application Data

[62] Division of Ser. No. 83,371, Jun. 29, 1993, Pat. No. 5,652,167.

[30] Foreign Application Priority Data

Jun. 30, 1992 [JP] Japan .................................. 4-173053
Aug. 31, 1992 [JP] Japan .................................. 4-232443

[51] Int. Cl.⁶ ........................................................ B32B 7/02
[52] U.S. Cl. .......................... 428/212; 428/188; 428/332; 428/542.8; 428/543
[58] Field of Search .............................. 428/178, 72, 212, 428/119, 188, 220, 322, 542.8, 534; 438/397

[56] References Cited

U.S. PATENT DOCUMENTS

| | | | |
|---|---|---|---|
| 4,613,518 | 9/1986 | Ham et al. .................................. | 216/6 |
| 5,084,324 | 1/1992 | Schinmer .................................. | 428/139 |
| 5,340,763 | 8/1994 | Dennison .................................. | 437/60 |
| 5,342,800 | 8/1994 | Jun .......................................... | 437/919 |

OTHER PUBLICATIONS

Stemme, Goran, "Resonant Silicon Sensors", J. Micromech. Microeng, vol. 1 (1991), pp. 113–125.

S. Wolf, "Silicon Processing for the VLSI Era", Lattice Press, vol. 2, (1991), pp. 214–215.

*Primary Examiner*—Donald Loney
*Attorney, Agent, or Firm*—Staas & Halsey

[57] ABSTRACT

A micro-structure including at least a first bendable member having first and second ends and being supported at the first end only, and either being spaced from a rigid component, or being spaced from a second bendable member also supported only at a first end thereof. The first member has a length L from the first end to the second end specified by one of the following equations: (a) for the first member adjacent to the rigid component: $L < (2Edt^3/3P)^{1/4}$, wherein E is a Young's modulus of a material of the first member; d is a distance of the space between the first member and the rigid component; t is a thickness of the first member; and P is an external pressure applied to the first member; or b) for the first member adjacent to the second member: $L < (2Ed't^3/3P)^{1/4}$, wherein E, t and P are as defined above; and d' is a distance of the space between the first and second members.

21 Claims, 7 Drawing Sheets

MICRO-STRUCTURES HAVING STRUCTURAL MEMBERS CAPABLE OF WITHSTANDING PERMANENT BEND

This application is a continuation division of application Ser. No. 08/083,371, filed Jun. 29, 1993, issued Jul. 29, 1997 as U.S. Pat. No. 652,167.

BACKGROUND OF THE INVENTION

1. Field of the Invention

The invention relates to micro-structures which are typically found in semiconductor devices and other minute devices such as resonant sensors or micromachines. More particularly, the invention relates to a method of liquid treatment of micro-structures comprising structural members liable to be bent during the process of the liquid treatment, and to micro-structures having structural members able to withstand permanent bend through the liquid treatment thereof. By way of example, such a micro-structure is often found in a capacitor of a semiconductor device called DRAM, in which the micro-structure is made up of structural members in the form of, e.g., a thin sheet, one end of which is fixed and the other end is free.

2. Description of Related Art

In capacitors of DRAM semiconductor devices referred to above, since the capacitors are required to have a certain capacity in very small, limited regions, the required capacitor areas can be secured by incorporating a three-dimensional construction such as a finned structure. Other minute devices, which are exemplified by resonant sensors and micromachines and made by applying processes used in the production of fine semiconductor devices, may employ micro-structures having members liable to be bent, such as fine beams or sheets, supported at one end or both ends thereof.

By way of example, a three-dimensional capacitor of a DRAM semiconductor device is illustrated in FIG. 1. In this drawing, 1 represents a semiconductor substrate, 2 and 3 are capacitor electrodes, and 4 is an insulating film. This capacitor is produced by the following procedure:

First, as shown in FIG. 2A, a first insulator film 11, a conductor film 12 for forming a horizontal electrode of the capacitor, and a second insulator film 11' are sequentially laminated on a semiconductor substrate 10. The insulator films 11 and 11' are formed by, e.g., chemical vapor deposition (CVD) of $SiO_2$, and the conductor film 12 is made by, e.g., CVD of polysilicon. Subsequently, holes are made in the laminated films so as to expose the surface of the substrate 10 at the bottoms of the holes, and a film of conductor 13 (polysilicon in this explanation) is then deposited, as shown in FIG. 2B. Inside the holes, the deposited polysilicon is connected to the former polysilicon film 12, and will support a horizontal electrode later formed from the film 12. The laminated films are then etched so as to leave separate, respective portions around the holes on the substrate, to thereby provide separate capacitor portions, as shown in FIG. 2C. Thereafter, the remaining insulator films 11 and 11' are etched and removed, while micro-structures 14 are left which form one of the capacitor electrodes, one end of which is fixed at the central support and the other is free. A thin film of silicon nitride is then formed by CVD to provide an insulator film 15 for the capacitor, as shown in FIG. 2D. Finally, a polysilicon film is formed to provide opposite electrodes, to thereby complete a capacitor of three-dimensional structure as shown in FIG. 1.

During the sequential manufacturing processes described above, liquids, such as an enchant solution and water, are used for the etching of the insulator films 11 and 11' and the pretreatment (i.e., washing) for the subsequent formation of silicon nitride film 15. Conventionally, in these treatments using liquids, the substrate bearing materials for the production of capacitor is immersed in the liquid, and then removed therefrom at atmospheric pressure. To the inventors, knowledge, it is not known in the art to use an environment of a pressure less than atmospheric pressure to which a substrate is removed from a treating liquid, as in the present invention.

When the micro-structure of one of the electrodes for capacitor as indicated by 14 in FIG. 2D is investigated after the etching of the laminated films for the formation of the separate capacitor portions (FIG. 2C), followed by the removal of the insulator film, a phenomenon may be observed in which the free end of a fin-like electrode 22 projecting from the support 21 is bent, and is in contact with the free end of another electrode 22 or the substrate 20, as shown in FIG. 3. The phenomenon will become more common as finer capacitors are made and the space between the fins and the thickness of the fins are accordingly reduced. In most cases, such a fin-like member brought into contact with another member or the substrate, will not be separated from the opposite member or substrate, that is, such a member will remain deformed. The bend and contact of the fin-like member with another member or substrate lead to the decrease in capacitor areas, and should therefore be eliminated.

Also, in resonant sensors such as those described in Goran Stemme, J. Micromech. Microeng., 1(1991) 113–125, a micro-structure having a beam-, bridge-, or diaphragm-like member of thin, flexural material is employed. Such a micro-structure in a resonant sensor is made by applying the production techniques used in the manufacture of semiconductor devices, such as photolithography and etching. Thus, the flexural members may suffer from permanent deformation through the bend and contact thereof with another component of the sensor during the production process of the member, which leads to a failure of the intended sensor, as in the production of capacitors of semiconductor devices described above.

Furthermore, similar micro-structures having a beam-, bridge-, or diaphragm-like member may also be used in various devices called micromachines, and can cause the same problem as in the above-mentioned micro-structures of DRAM semiconductor devices and resonant sensors.

SUMMARY OF THE INVENTION

It is an object of the invention to provide a method of liquid treatment of micro-structures comprising at least a structural member liable to be bent, which can prevent the permanent deformation of the member through the treatment.

It is another object of the invention to provide a micro-structure comprising at least a member supported at one end thereof and liable to be bent, which is capable of avoiding permanent deformation of the member resulting from a liquid treatment.

According to an aspect of the invention, there is provided a method of liquid treatment of a micro-structure including at least a structural member liable to be bent, the member being formed so as to leave a space between the same and another member liable to be bent and/or other rigid component, the method comprising placing the micro-structure in a treating liquid, and subsequently removing the micro-structure therefrom, wherein the micro-structure is removed from the liquid to an environment having a pressure less than the atmospheric pressure.

In a variation of the method of the invention, the micro-structure in the treating liquid is then displaced therefrom to another treating liquid having a smaller surface tension than that of the former treating liquid, and is subsequently removed from the latter treating liquid. In other words, the micro-structure is placed in a first treating liquid and then in a second treating liquid having a smaller surface tension than that of the first liquid, and subsequently removed from the second liquid.

Alternatively, the method of the present invention may include drying the micro-structure removed from the treating liquid by exposing the micro-structure to vapor of a liquid having a smaller surface tension than that of the treating liquid.

According to another aspect of the invention, the micro-structure is removed from the treating liquid to the atmosphere, and is then dried using laser light, infrared radiation, an electron beam, microwaves, or ultrasonic waves.

As is used herein, the term "micro-structure" refers to a structure or construction including a member or members having minute dimensions of, e.g., the order of micron or submicron, which is made using processes for creating very small structures, such as those employed in the production of semiconductor devices. Thus, a substrate made of, e.g., silicon is generally used for the formation of a number of micro-structures thereon. The micro-structures made on a substrate may be treated together according to the inventive method, by immersing the substrate, on which the micro-structures have been formed, in the treating liquid.

The term "liquid treatment" refers to any treatment in which micro-structures including at least a member liable to be bent under an external force are treated using a liquid. Thus, the treatment includes immersion of micro-structures in a treating liquid in a container, placement of micro-structures in a flowing liquid, and the like. The treatment involves the subsequent removal of the micro-structures from the liquid used.

According to a further aspect of the invention, there is provided a micro-structure including at least a first member having first and second ends and being supported at only one end thereof being susceptible to bending, spaced from a second member also supported at a first end thereof and being susceptible to bending, and/or a rigid component, wherein the first member has a length L from the first supported end to the second end specified by the following equation:

(a) for the first member adjacent to only the rigid component:

$$L<(2Edt^3/3P)^{1/4}$$

wherein E is a Young's modulus of the material of the first member;

d is a distance between the first member and the component;

t is a thickness of the first member; and

P is an external pressure applied to the first member; or (b) for the first member adjacent to the second member:

$$L<(Ed't^3/3P)^{1/4}$$

wherein E, t and P are as defined above; and d' is a distance between the first and second members.

The foregoing and other objects as well as the characteristic features of the invention will be more apparent and easily understood by the following description and the appended claims when read in conjunction with the accompanying drawings. A person with ordinary skill in the art understanding the invention would readily appreciate that the invention successfully solves the above-mentioned problems in the prior art.

DESCRIPTION OF THE PREFERRED EMBODIMENTS

Figure 1:
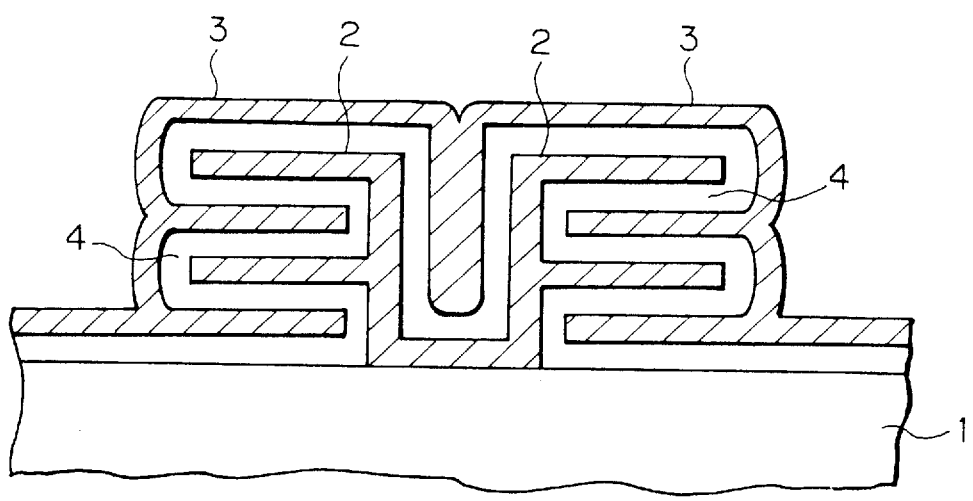
FIG. 1 schematically shows an illustration of a capacitor having a fin-like structure in a DRAM device.

According to the method of the invention, micro-structures having a member or members prone to be bent, which have generally been formed on a substrate, are placed in a treating liquid,by, e.g., immersing the substrate in the liquid, and are then removed together with the substrate from the liquid to an environment having a pressure less than the atmospheric pressure. The removal of the micro-structures can be carried out by, e.g., removing the substrate from the liquid or drawing out the liquid from a container for the liquid, as discussed hereinafter in more detail.

Alternatively, the micro-structures on a substrate are first placed in a first treating liquid and then in a second treating liquid having a smaller surface tension than that of the first liquid, and thereafter removed from the second liquid. In this embodiment, the micro-structures may be removed from the second treating liquid to an environment of the atmospheric pressure or a pressure less than the atmospheric pressure. The second liquid should be compatible with the first liquid so as to effect the complete exchange of the liquids surrounding the micro-structures. When the first treating liquid is water or an aqueous solution, the second liquid can be exemplified by an organic solvent, such as a ketone, e.g., acetone, or an alcohol, e.g., ethanol, isopropyl alcohol, and isobutyl alcohol, and water containing a surfactant.

In the present invention, the term "removal" or "removing" involves the removal of micro-structure from an environment to another (e.g., from a liquid environment to a vacuum environment), and which is not necessarily accompanied by the spatial or locational movement of the micro-structure itself. The removal of micro-structures, according to the invention may advantageously effected by the exchange of environments surrounding the micro-structure while keeping the micro-structure stationary. The exchange of environments can easily be carried out, e.g., by simple discharge of a liquid from a container thereof, or replacement of liquid in a container.

The micro-structures after the removal from a treating liquid may be dried. When the micro-structures are treated together with a substrate therefor by the treating liquid, the drying may be effected by heating one or both of the micro-structures and the substrate bearing the same. For the heating, a procedure can advantageously be used such as irradiation by laser light, infrared radiation, electron beam, or microwaves. Alternatively, the substrate may be heated by applying an ultrasonic wave having a frequency of preferably 1 GHz or more thereto.

It has been found that the drying of the micro-structures may also be effected by exposing the micro-structures removed from a treating liquid to a vapor of a liquid having a smaller surface tension than that of the treating liquid. In this alternative, the micro-structures removed from the treating liquid may be placed into a chamber, and the drying vapor can be externally supplied to the chamber, or be generated in the chamber, e.g., by heating the liquid. The liquid for providing the drying vapor should be compatible with the treating liquid. When the treating liquid is water or an aqueous solution, an organic solvent can be used such as an alcohol, e.g., ethanol, isopropyl alcohol, and isobutyl alcohol, or a ketone, e.g., acetone.

The treating liquid in which micro-structures are placed is believed to be responsible for the permanent deformation of the structural members of the micro-structures, after the liquid treatment, which are susceptible to an external force and liable to be bent or deformed. More specifically, the micro-structures, immediately after the removal from the treating liquid, are wetted by the liquid, and then spontaneously or forcedly dried. During the drying process, the liquid present between a structural member liable to be bent and another member or different rigid component will cause an external force applied to the member. This phenomenon will be described below in more detail.

Figure 4:
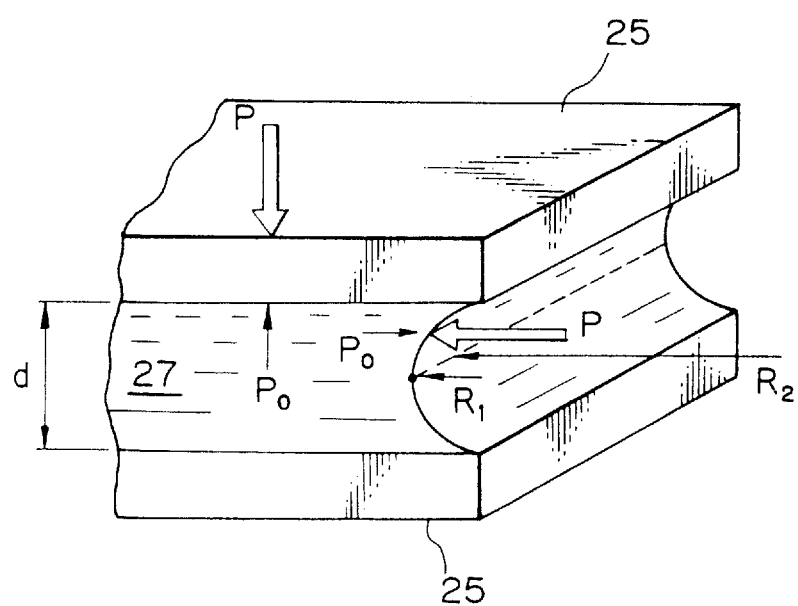
FIG. 4 is a model illustrating pressure acting on a fin due to surface tension of water present between one fin and another fin.

Referring to FIG. 4, there is shown a portion of free ends of two adjacent fins 25 included in a micro-structure. After the removal of the micro-structure from water as a treating fluid, there is water 27 between two fins 25. In the course of drying, the surface of water 27 present between the fins 25 is concave, as illustrated in FIG. 4. In this situation, considering the action of surface tension of water, the internal pressure $p_o$ of water 27 is smaller than the external pressure P. In terms of the fin-like member, one face is subjected to the external pressure P, while the other face is subjected to a pressure equal to the internal pressure $p_o$ of the water, since it contacts the water 27. The deformation of fins occurring in the course of drying may be explained by a difference between the external pressure P applied to one side of each fin and the internal pressure $p_o$ in the other side thereof.

The pressure difference ($\Delta$P) between the external pressure applied to the fin-like member and the internal pressure of water is calculated using the following Laplace's equation:

$$\Delta P = \gamma \left( \frac{1}{R_1} + \frac{1}{R_2} \right) \quad (1)$$

wherein $\gamma$ is the surface tension of a fluid; and $R_1$ and $R_2$ are primary radii of curvature.
Provided that the treating liquid is water having a surface tension of 73 dyn/cm, $R_1 = -2.5 \times 10^{-6}$ cm (contact angle=0°; distance d between fins=$5 \times 10^{-6}$ cm), and $R_2 = -\infty$, the pressure difference $\Delta P$ is calculated to be approximately 30 atmospheres.

The pressure difference resulting from the surface tension of water can thus reach 30 atmospheres on calculation. However, even if the external pressure is a maximum of 1 atmosphere, as is in the prior art, the internal pressure of water never becomes negative. In the case of a substantially large pressure difference, the internal pressure of water is thus regarded as nearly zero, and only the external pressure applied to the fin side not contacting the water can be considered to have an effect on the fin. Thus, the pressure applied to the fin can be reduced, and the fin may be prevented from bending, if the external pressure is reduced. In this way, the method of the present invention, in which the micro-structures are removed from a treating liquid to an environment of a pressure less than the atmospheric pressure, allows the reduction of the external pressure applied to the structural members, to thereby inhibit the permanent deformation of members.

As can be seen from the above equation (1), the pressure applied to the fin may also be reduced, if the surface tension of fluid remaining between the adjacent fins is lowered. Thus, the inventive method, in which the micro-structures are placed in a first treating liquid having a larger surface tension and then in a second liquid having a smaller surface tension, also allows the reduction of the external pressure, to thereby prevent the permanent deformation of structural members of the micro-structures. The displacement of the micro-structures to be treated from the first fluid to the second one is not necessarily carried out by moving the micro-structures from one container of the first fluid to the other container of the second fluid. In the present invention, it is advantageous to exchange the first liquid with the second liquid in the same container in which the micro-structures are put in to be immersed in the content fluid. The first and second treating liquids should be compatible with each other in order to allow the easy replacement of the liquids between the adjacent members (or between a member and a different rigid component).

For example, when water is used as the first fluid, the second fluid may be acetone, ethanol, isobutyl alcohol, or a surfactant-containing water. In this case, the second fluid has a surface tension of about 20 dyn/cm, equivalent to a quarter of the surface tension of water. Accordingly, the pressure difference $\Delta P$ between the external pressure and the internal pressure of water may be expected to be below 1 atmosphere according to conditions of wetting and drying of the fins, and the pressure applied to the fins may thus be reduced. In the case of the treatment of micro-structures for semiconductor devices, since the substrate on which micro-structures have been formed would often be subjected to the subsequent process such as deposition of insulator film, the amount of impurities, such as alkali metals and heavy metals, contained in the second liquid would be controlled so as to be 10 ppb or less.

Using fluids different in surface tension, since a reduced $\Delta P$ can be expected as described above, an environment to which micro-structures are removed from the second liquid may have the atmospheric pressure or a pressure less than the atmospheric pressure.

The inventors have further found that it is similarly effective in preventing permanent deformation of structural members of micro-structures after the removal from a treating liquid, to dry the micro-structures removed from the treating liquid by exposing the micro-structures to a vapor of a liquid having a smaller surface tension than that of the treating liquid. In this case, it is believed that the treating liquid, e.g., water, remaining between the structural members is gradually replaced by the vapor of the other liquid of lower surface tension, and the surface tension of remaining liquid itself is consequently reduced, to thereby result in the reduction in the difference between an external pressure and an internal pressure of the treating liquid.

In the model depicted in FIG. 4, it is postulated that the surface of the liquid interposed between the fins is concave and stable. When an appropriate energy is externally supplied to the liquid surface to put it into disorder, a greatly reduced pressure difference between the external pressure and the internal pressure of water may be contemplated.

Techniques for putting a liquid surface into disorder include irradiating the micro-structures or a supporting substrate therefor with an energy beam of high intensity to thereby rapidly heat the same. The water between members such as fins is rapidly evaporated by the heating, and the pressure created during the evaporation causes the liquid surface to tremble, to thereby prevent the formation of a stable concave. As energy sources, laser light, infrared radiation, electron beam, microwave and the like may be used.

Another way of supplying energy to put a liquid surface into disorder is to apply an ultrasonic wave to the supporting substrate for micro-structures. It is advantageous to use an ultrasonic wave having a sufficiently high frequency. In general, it is preferable to use an ultrasonic wave having a frequency of 1 GHz or more. More particularly, ultrasonic waves having a wavelength of up to about ten times the distance between fins may be expected to have an effect. By way of example, for the distance between fins of $5 \times 10^{-6}$ centimeters, a preferred frequency of ultrasonic wave is 3 GHz or more.

The externally supplied energy thus allows the micro-structures to be dried, preventing the structural members of the micro-structures from being permanently deformed. Therefore, the external energy supply may be employed for drying the micro-structures removed from a treating liquid to the atmosphere, as well as for drying the micro-structures removed to an environment having a pressure less than the atmospheric pressure and those removed from a second treating liquid having a lower surface tension.

Although the mechanism of permanent deformation of structural members liable to be bent in micro-structures has not been fully known, the permanent deformation may result from the contact of a member such as a fin with another member (or other rigid component), and the accompanying bonding of the members in the contact area, which might be caused by an attraction force on an atomic or molecular level. Thus, even though the member is bent by the pressure applied thereto after the removal from a treating liquid, the member can return to the former condition, i.e., the condition of no contact of the member with another member, after the disappearance of the pressure causing the bend of the member.

The structural members which are supported at one end and free at the other end are evidently much more susceptible to permanent deformation than those supported at both ends. In the case of structural members supported at only one end, such as fins, it is possible to avoid permanent deformation due to the contact of the free end thereof with another free end of a second member or a rigid component such as a substrate for supporting the micro-structures including the members, when the members or fins have appropriate thickness and length from the supported end to the free end, as discussed in the following sections.

Figure 5A:
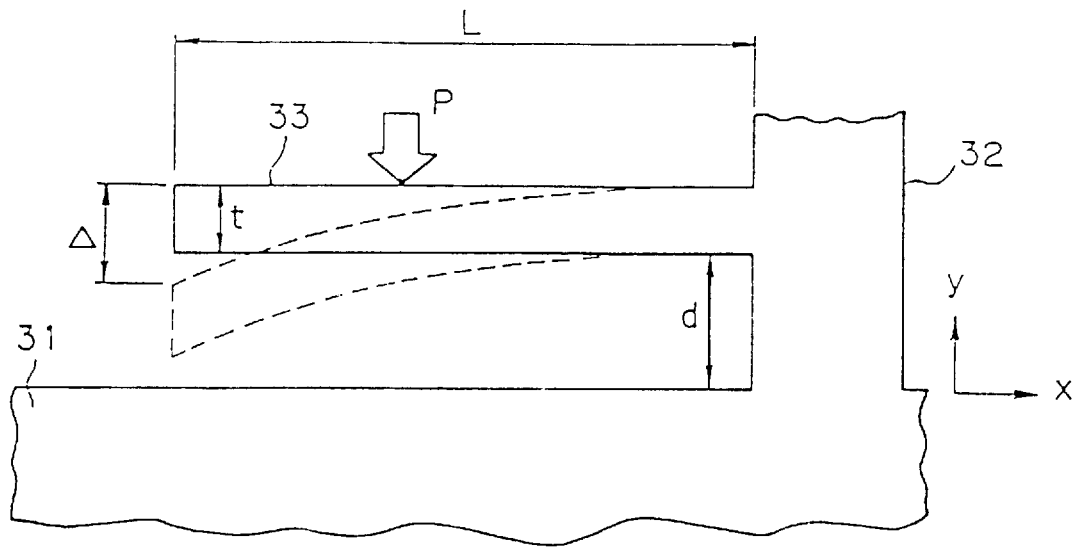
FIGS. 5A and 5B illustrations how members are bent by the effect of pressure applied thereto.

Referring to FIG. 5A, there is shown a fin 33 before bending by the solid line, which is supported at one end by a supporting member 32, and which in turn is supported by a substrate 31. The broken line in this drawing indicates the bent fin. In this situation, the substrate 31 as well as the supporting member 32 are regarded as rigid bodies, and are therefore not deformable. The bend Δ of the fin due to the free end being undergoing a pressure P is determined by the following equation (It should be noted that the width of the fin is assumed hereinafter to be 1 centimeter of unit length for simplification, and thus is not included in the equations presented below.):

$$\Delta = PL^4/8EI$$
$$= 3PL^4/2Et^3$$

wherein P is a pressure applied to the fin;

L is a length of the fin;

t is a thickness of the fin;

E is a Young's modulus of the material of the fin; and

I is a moment of inertia of the cross section, represented by the following equation:

$$I = \int_{-t/2}^{t/2} y^2 dy$$
$$= t^3/12$$

In this case, since the bend of fin 33 is not related directly to the width of the fin, the condition for the fin 33 not to come into contact with the substrate 31 is that the bend is smaller than the distance d between the fin and the substrate, i.e., Δ<d. Converting this relationship to an equation for L, the following is obtained:

$$L < (2Edt^3/3P)^{1/4} \quad (2)$$

Figure 5B:
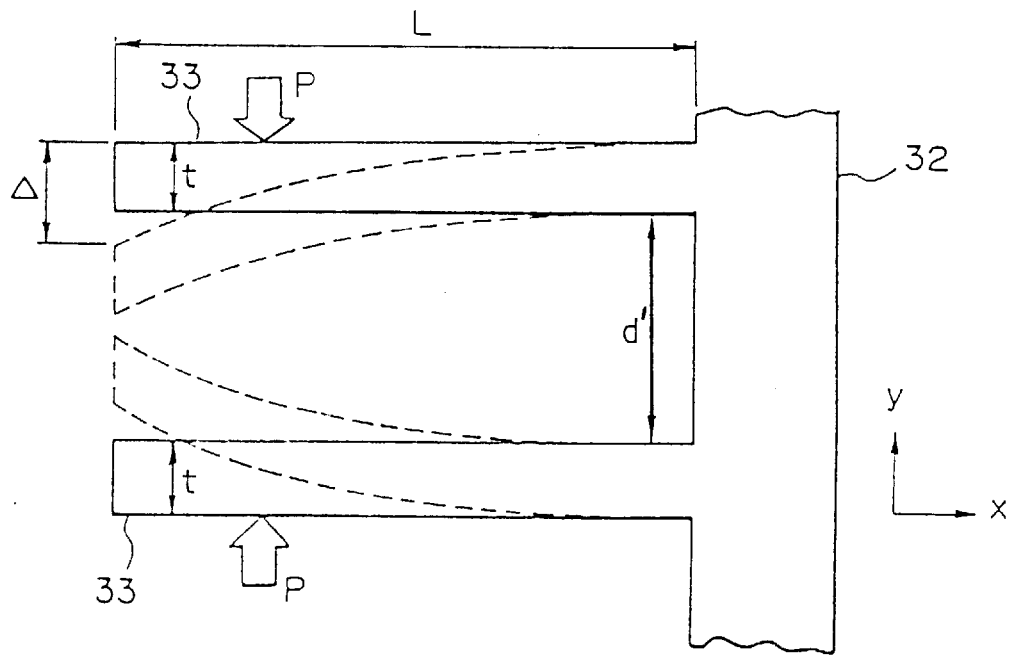

When there are adjacent fins, as shown in FIG. 5B, these fins can be bent toward each other. Thus, the allowable bend in this case is half of the distance d' between the fins, and the following equation is obtained:

$$L < (Ed't^3/3P)^{1/4} \quad (3)$$

The members designed so as to meet the relationship represented by equation (2) or (3) are free from permanent deformation, because a member does not come into contact with an adjacent member or substrate even if the members suffer an external pressure.

Equation (3) may approximately be applied to adjacent members made of different materials and different Young's moduli: unless the members exhibit excessively different modulus values.

To facilitate appreciation and understanding of the invention, the following examples are presented. The invention, however, is not limited to these examples.

EXAMPLE 1

Micro-structures including fin-like members were formed on a supporting substrate of silicon. The micro-structures were made of polysilicon.

Figure 2A:
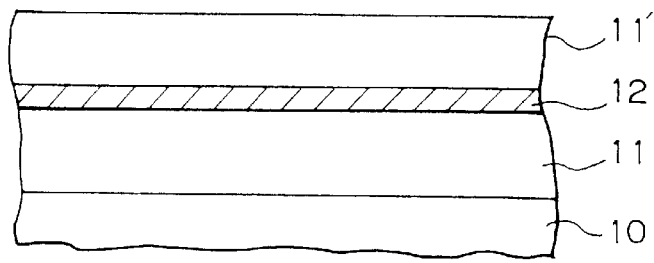
FIGS. 2A to 2D illustrate the process for the production of the capacitor shown in FIG. 1.
Figure 2B:
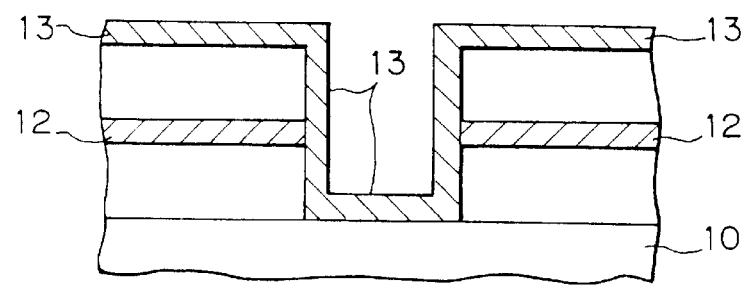
Figure 2C:
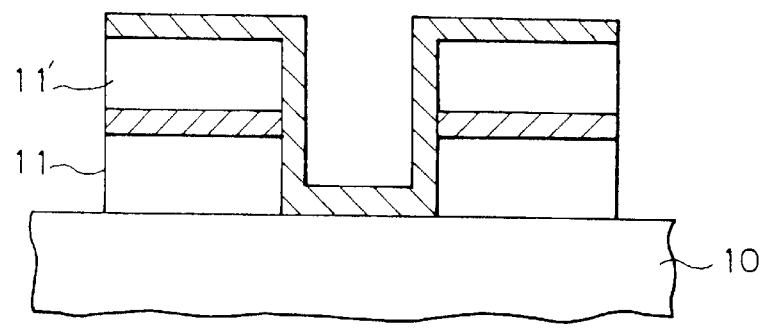
Figure 2D:
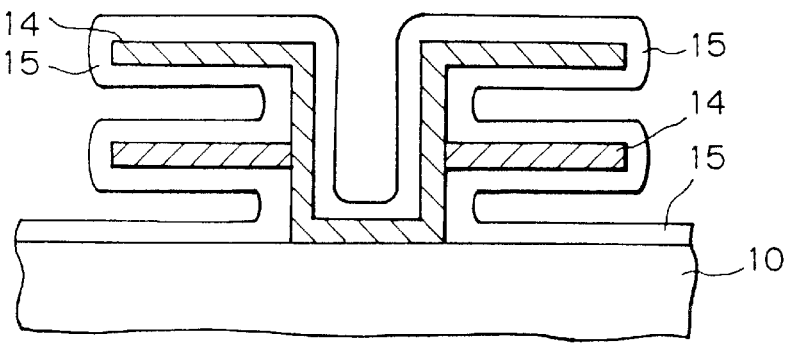
Figure 3:
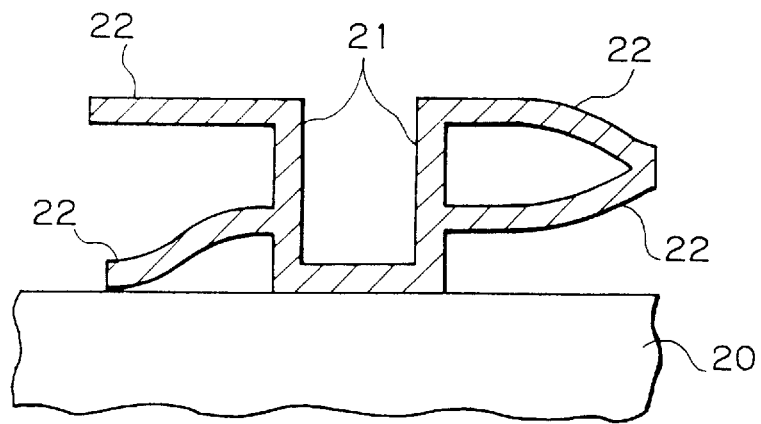
FIG. 3 schematically shows structural members permanently deformed by the bend thereof.

The procedure described hereinbefore in reference to FIGS. 2A to 2C was employed. (It should be noted that the ratios of thickness of various layers or films as well as the dimensions of the micro-structure in these drawings are not to scale for convenience.)

First, a first insulator film 11 of $SiO_2$ as a spacer, a conductor film 12 of polysilicon for the fin material, and a second insulator film 12' of $SiO_2$ were sequentially deposited on a silicon substrate 10 by CVD (FIG. 2A). The thickness of each film was 500 angstroms. Holes having a diameter of 0.5 micrometers were then made in the laminated films so as to expose the surface of the substrate of silicon at the bottoms thereof, after which a polysilicon film 13 was redeposited by a thickness of 500 angstroms (FIG. 2B). Subsequently, the laminated films were etched so as to leave three types of sections around the holes for later providing fins 0.7, 1.2, and 2.0 micrometers length (FIG. 2C). The remaining spacer insulator films 11, 11' were then etched out by a diluted solution of hydrofluoric acid, to thereby form micro-structures having fin-like members. The substrate bearing the formed micro-structures was removed from the etching bath, and was moved into a container containing water for washing.

Subsequently, the substrate was pulled out of the water container to allow the micro-structures to be dried in the air. After the drying, the treated fins were inspected by microscopy. The results are shown in Table 1, as percent of deformed or bent fins.

TABLE 1

| Fin length (μm) | Percent of bent fins (%) |
|---|---|
| 0.7 | 0 |
| 1.2 | 43 |
| 2.0 | 100 |

The micro-structures in this example have two adjacent fin members, and both fins have potentiality of being bent. Accordingly, the boundary value of fin length, which represents the length possibly leading to permanent deformation of fins, if the fin length is beyond the same, is calculated by equation (3) to be 1.37 micrometers, under the conditions of external pressure of 1 atmosphere. As can be seen in Table 1, fins having a length of 0.7 microns (much shorter than that boundary value) resulted in no deformation, and fins having a length of 1.2 microns slightly shorter than the boundary value involved 43 percent deformation. In contrast, all fins having a length of 2.0 microns (longer than the boundary value) were permanently deformed. Thus, for the water treated fins to be free from permanent deformation, it was revealed that selection of a structural parameter at least meeting equation (3) is required. This confirms the validity of equation (3).

EXAMPLE 2

Figure 6:
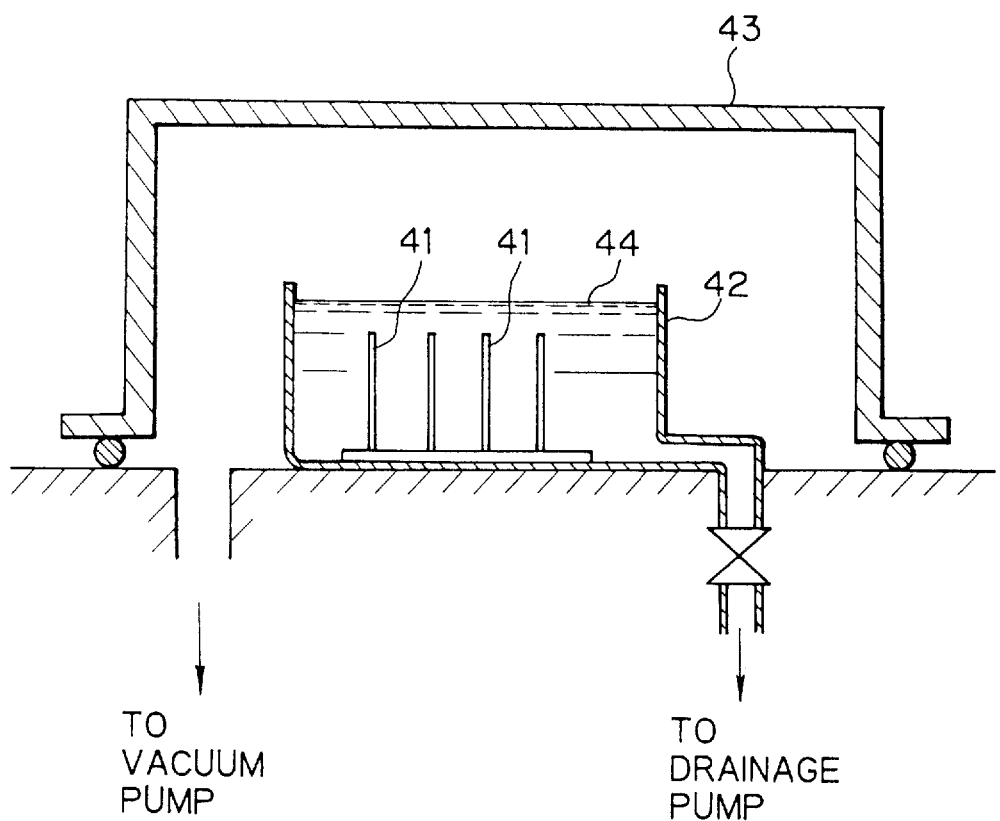
FIG. 6 is a schematic view illustrating the process in vacuum used in Example 2.

Using the procedure as described in Example 1, similar micro-structures were formed on several substrates of silicon. As shown in FIG. 6, after etching, the substrates 41 on which three types of micro-structures as those in Example 1 had been formed were placed in a water container 42, which in turn was put in a vacuum chamber 43. The chamber 43 was then evacuated by a vacuum pump (not shown) to reduce the pressure therein to 0.3 atmospheres. Subsequently, the water 44 in the container 42 was discharged using a drainage pump (not shown) to allow the micro-structures to be dried, while the vacuum condition was maintained. After the drying, the fin members of the micro-structures were examined by microscopy. The results are shown in Table 2.

TABLE 2

| Fin length (μm) | Percent of bent fins (%) |
|---|---|
| 0.7 | 0 |
| 1.2 | 0 |
| 2.0 | 100 |

In this case, the boundary value of fin length is calculated to be 1.81 micrometers by equation (3) for the external pressure of 0.3 atmospheres. This agrees with the fact that an improved percent of bent fins (0%) was obtained for the fins having a length of 1.2 micrometers, whereas 100% of fins having a length of 2.0 micrometers were permanently deformed as before.

EXAMPLE 3

Using the procedure as described in Example 1, three similar types of micro-structures were formed on silicon substrates. After etching, the substrates were placed in a water container, and were then moved into an acetone container. One hour after, the substrates were removed from the acetone container to allow drying. The fin members of the dried micro-structure were then examined by microscopy. The obtained results are shown in Table 3.

TABLE 3

| Fin length (μm) | Percent of bent fins (%) |
|---|---|
| 0.7 | 0 |
| 1.2 | about 30 |
| 2.0 | 100 |

It is apparent that the use of acetone having a lower surface tension as a second liquid significantly lowered percent of bent fins at 1.2 micrometer fin length compared with the results in Example 1.

EXAMPLE 4

Using the procedure as described in Example 1, three similar types of micro-structures were formed on substrates. After etching, the substrates were placed in a water container for washing. Subsequently, the substrates were taken out from the container, and immediately irradiated with a pulse laser light (wavelength=6900 angstroms), so as to be provided with an energy of 0.5 joules/pulse for an area of 2×2 cm only one time. The fin members of the micro-structures in the irradiated area were then examined by microscopy. The results are shown in Table 4.

TABLE 4

| Fin length (μm) | Percent of bent fins (%) |
|---|---|
| 0.7 | 0 |
| 1.2 | 8 |
| 2.0 | 100 |

It is apparent that the rapid evaporation of water on the substrate by the irradiation of laser light evidently lowered percent of bent fins at 1.2 micrometer fin length compared with the results in Example 1.

EXAMPLE 5

This example specifically illustrates the production of a fin-type stack capacitor in a DRAM cell. In this example, the capacitors were made using the method according to the present invention, in which micro-structures removed from a treating liquid are dried by exposing the micro-structures to a vapor of a liquid having a smaller surface tension than that of the treating liquid.

Figure 7A:
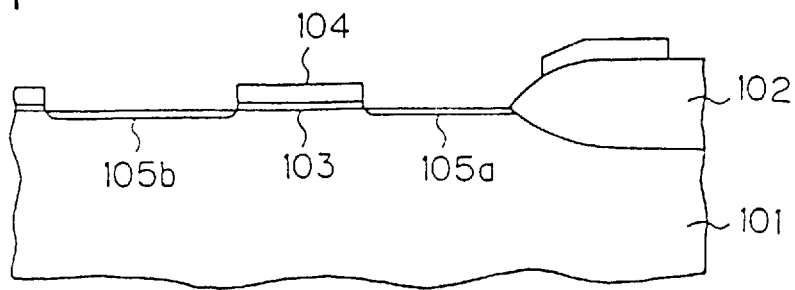
FIGS. 7A to 7G show the process for the production of the capacitors for semiconductor devices described in Example 5.

As shown in FIG. 7A, field oxide films 102 made of $SiO_2$ and having a thickness of 2500 angstroms for separating elements were formed on a silicon substrate 101. A gate oxide film 103 having a thickness of 100 angstroms was then formed on the substrate 101 at a given area of each element region between the field oxide films 102, and on this gate oxide film 103, a gate electrode 104 of polysilicon having a thickness of 1000 angstroms was formed. Subsequently, impurity-diffused regions 105a and 105b for source and drain regions were formed in the substrate 101 between the gate electrode 104 and the field oxidized film 102. (The gate electrode 104 also forms a word line in a memory cell array.)

Figure 7B:
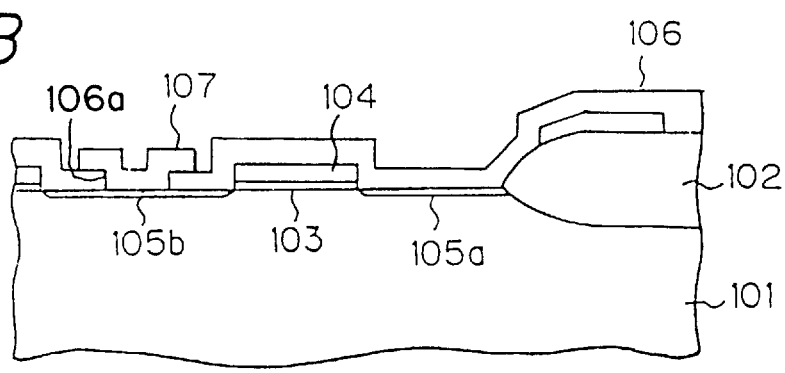

An interlayer insulation film 106 having a thickness of 500 angstroms was then formed to totally cover the different films and regions on the substrate as described above. The formed insulation film 106 was etched to make contact holes 106a at the bottoms of which the drain regions 105b were exposed. Bit lines 107 of polysilicon were then formed so as to come into contact with the exposed drain regions 105b, as shown in FIG. 7B.

Figure 7C:
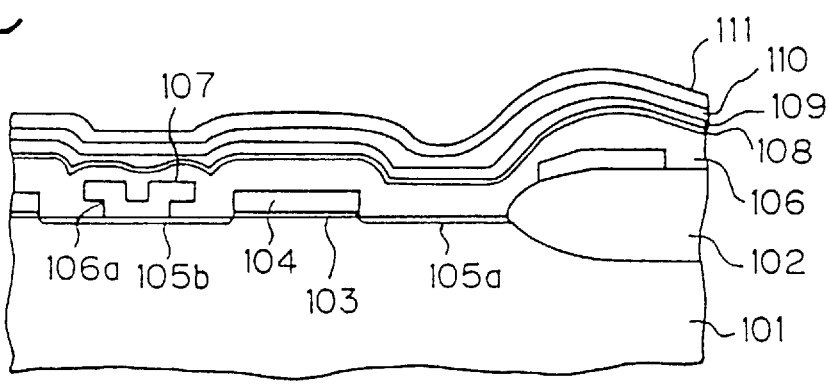

Subsequently, as shown in FIG. 7C, a nitride film 108 (300 angstroms in thickness), an oxide film 109 of $SiO_2$ (500 angstroms), a silicon film 110 of polysilicon (amorphous silicon may also be used) (500 angstroms), and an oxide film 111 of $SiO_2$ (500 angstroms) were sequentially deposited by CVD. (The silicon film 110 later forms a lower electrode of each fin-type capacitor.)

Figure 7D:
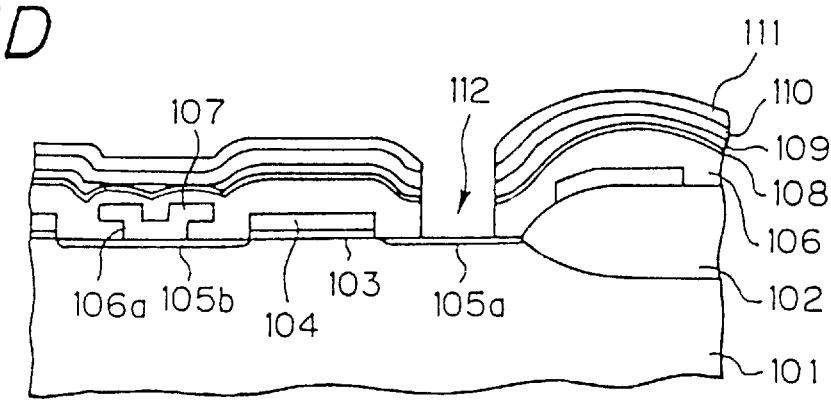

To make contact holes 112 for effecting the contact of capacitor electrodes with the source regions 105a, the oxide film 111, silicon film 110, oxide film 109, nitride film 108, and interlayer insulation film 106 were etched, to expose the source regions 105a, as shown in FIG. 7D.

Figure 7E:
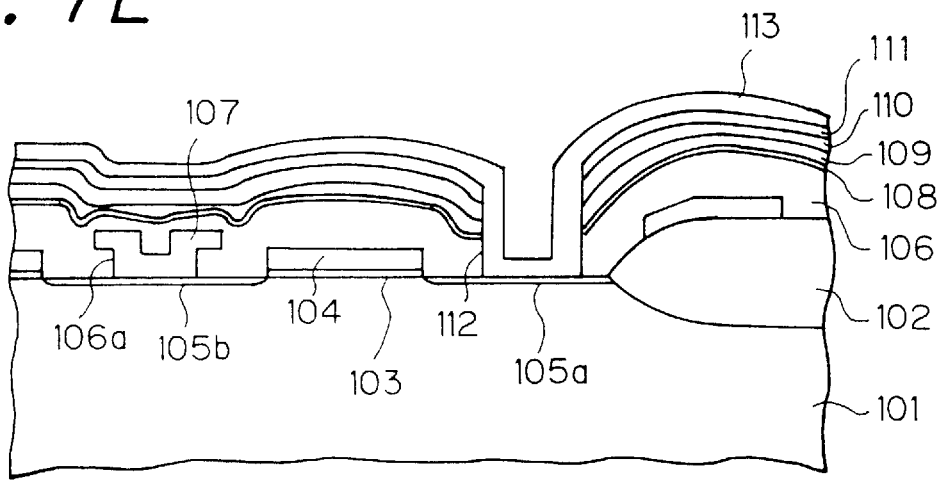

Polysilicon was then deposited by CVD to make a silicon film 113 having a thickness of 500 angstroms, as shown in FIG. 7E, so as to come into contact with the source regions 105a exposed at the bottoms of the contact holes 112 and the silicon film 110 for the lower electrodes of capacitors exposed at the walls of the contact holes 112. Amorphous silicon may be used for the silicon film 113. This silicon film 113 later forms the upper electrodes of each fin-type capacitor.

Figure 7F:
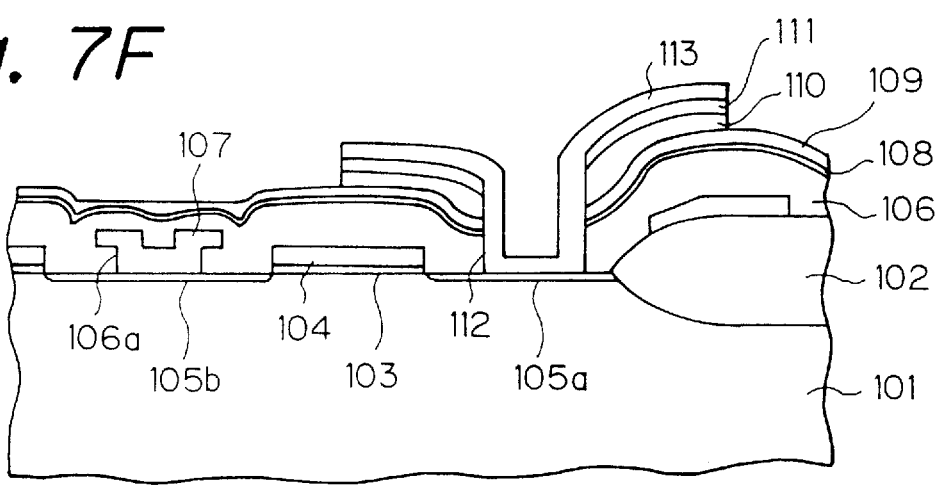

Subsequently, the silicon film 113, oxide film 111, and silicon film 110 were sequentially patterned by etching for producing desired capacitors, as indicated in FIG. 7F.

Figure 7G:
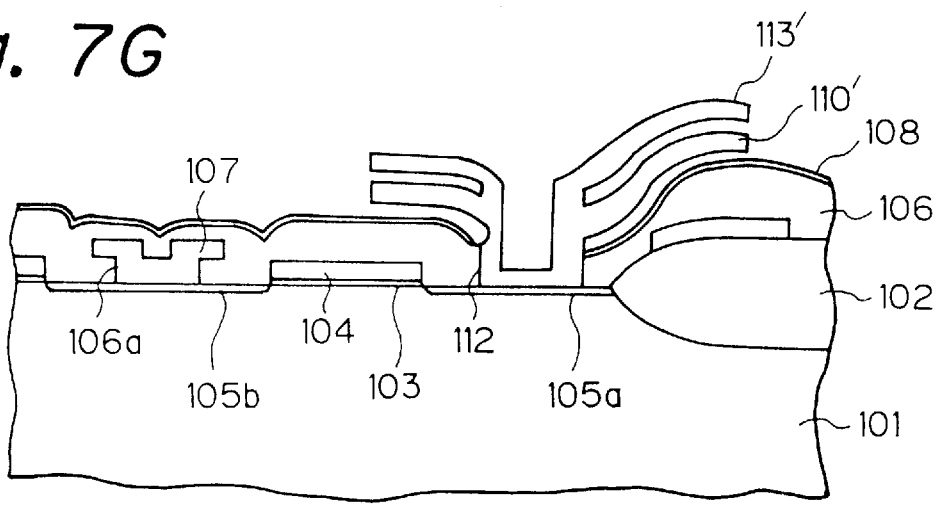

Using hydrofluoric acid, the remaining oxide film 111 between the silicon films 110 and 113, which later formed capacitor electrodes, and the remaining oxide film 109 on the nitride film 108, which later served as an etching stopper, were removed, as shown in FIG. 7G. On this process, two fins of silicon 110' and 113' were created which form electrodes of a capacitor of fin-type micro-structure. These fins 110' and 113' were then washed with pure water to remove a residue of SiF present on the surfaces of the fins 110', 113' after the removal of the oxide films 109, 111, as a result of the treatment by hydrofluoric acid, since the residue of SiF would cause deterioration in the characteristics of the insulator films of the capacitors. During the washing, water, which may contain fluorine in some cases, penetrates into the spaces between the fins 110', 113', and can cause permanent deformation of the fins as mentioned hereinbefore. To prevent the deformation of the fins, the wetted substrate was then moved into a chamber (not shown), into which vapor of isopropyl alcohol (temperature=83° C.) was externally supplied, to thereby effect the removal of the residual water and drying of the formed capacitors.

By microscopy, it was found that the resultant fins, which had a length of 1.1 micrometers, were free from permanent deformation. In contrast, some of the fins having a similar length, but made by drying the same in the atmosphere, suffered permanent deformation.

For completion of DRAM semiconductor devices provided with a fin-type capacitor, an insulator film and opposed electrodes would additionally be formed through a conventional process, to complete capacitors, and further, an interlayer insulation film and a conductor layer thereon would be formed.

As can be seen from the foregoing, the present invention allows liquid treatment of micro-structures including at least a structural member liable to be bent without allowing the member to be permanently deformed. Although the invention is mainly described herein by the illustration of fin-like member such as commonly found in a capacitor of a DRAM semiconductor device, it would be clear to one of ordinary skill that the invention may equivalently be applied to other micro-structures, such as those called micromachines and resonant sensors referred to hereinbefore, which are produced by a production process similar to that employed for the production of semiconductor devices.

We claim:

1. A micro-structure, comprising: a first bendable elongated member having a first, fixed end and a second free end and, being spaced substantially parallel from one of a second bendable elongated member having a first, fixed end and a second, free end, and a rigid component, wherein the first member has a length L from the first end to the second end specified by one of the following equations:

a) for the first member spaced from the rigid component
$L<(2Edt^3/3P)^{1/4}$ wherein E is a Young's modulus of a material of the first member, d is a distance of the space between the first member and the rigid component, t is a thickness of the first member, and P is an external pressure applied to the first member; and b) for the first member spaced from the second member
$L<(Ed't^3/3P)^{1/4}$ wherein E, t and P are as defined above, and d' is a distance of the space between the first and second members.

2. The micro-structure as recited in claim 1, wherein the first member is a fin of a capacitor.

3. The micro-structure as recited in claim 1, wherein the second member is a fin of a capacitor.

4. The micro-structure as recited in claim 1, wherein the rigid member is a substrate.

5. The micro-structure as recited in claim 1, wherein the first and second members are made of polysilicon.

6. The micro-structure as recited in claim 1, wherein t is about 500 angstroms.

7. The micro-structure as recited in claim 1, wherein 0.7 micrometers $\leq L \leq 1.2$ micrometers.

8. The micro-structure as recited in claim 1, wherein the micro-structure is a fin-type stack capacitor in a DRAM cell.

9. A semiconductor micro-structure, comprising: a first bendable elongated member having a first, fixed end and a second, free end, and being spaced substantially parallel to a second bendable elongated member having a first, fixed end and a second, free end, wherein the first member has a length L from the first end to the second end specified by the following equation $$L<(Ed't^3/3P)^{1/4}$$

wherein E is a Young's modulus of a material of the first member, t is a thickness of the first member, P is an external pressure applied to the first member, and d' is a distance of the space between the first and second members.

10. The micro-structure as recited in claim 9, wherein the first member is a fin of a capacitor.

11. The micro-structure as recited in claim 9, wherein the second member is a fin of a capacitor.

12. The micro-structure as recited in claim 9, wherein the first and second members are made of polysilicon.

13. A The micro-structure as recited in claim 9, wherein t is about 500 angstroms.

14. The micro-structure as recited in claim 9, wherein 0.7 micrometers $\leq L \leq 1.2$ micrometers.

15. The micro-structure as recited in claim 9, wherein the micro-structure is a fin-type stack capacitor in a DRAM cell.

16. A semiconductor micro-structure, comprising: a first, bendable elongated member having a first, fixed end and a second free end, and being spaced substantially parallel to a relatively more rigid component, wherein the first member has a length L from the first end to the second end specified by the following equation $$L<(2Edt^3/3P)^{1/4}$$

wherein E is a Young's modulus of a material of the first member, d is a distance of the space between the first member and the rigid component, t is a thickness of the first member, and P is an external pressure applied to the first member.

17. The micro-structure as recite din claim 16, wherein the first member is a fin of a capacitor.

18. The micro-structure as recited in claim 16, wherein the relatively more rigid component is a substrate.

19. The micro-structure as recited in claim 16, wherein t is about 500 angstroms.

20. The micro-structure as recited in claim 16, wherein 0.7 micrometers $\leq L \leq 1.2$ micrometers.

21. The micro-structure as recited in claim 16, wherein the micro-structure is a fin-type stack capacitor in a DRAM cell.

* * * * *

UNITED STATES PATENT AND TRADEMARK OFFICE
CERTIFICATE OF CORRECTION

PATENT NO.:   5,888,633
DATED     :   March 30, 1997
INVENTOR(S):  NAKANO et al.

It is certified that error appears in the above-identified patent and that said Letters Patent is hereby corrected as shown below:

Col. 4,   line 21, change "illustrations" to --illustrate--;
          line 62, after "advantageously" insert --be--.

Col. 8,   line 1, delete "being";
          line 24, after "of" insert --the--.

Col. 9,   lines 9-10, change "there y" to --thereby--.

Signed and Sealed this

Sixteenth Day of November, 1999

Attest:

Q. TODD DICKINSON

*Attesting Officer*          Acting Commissioner of Patents and Trademarks